(12) United States Patent
Burghardt et al.

(10) Patent No.: US 9,070,797 B2
(45) Date of Patent: Jun. 30, 2015

(54) PHOTOVOLTAIC INSTALLATION

(71) Applicant: Kostal Industrie Elektrik GmbH, Luedenscheid (DE)

(72) Inventors: Frank Burghardt, Iserlohn (DE); Mirko Haardt, Wilnsdorf (DE); Andreas Forck, Oer-Erkenschwick (DE)

(73) Assignee: Kostal Industrie Elektrik GmbH, Luedenscheid (DE)

( * ) Notice: Subject to any disclaimer, the term of this patent is extended or adjusted under 35 U.S.C. 154(b) by 238 days.

(21) Appl. No.: 13/648,698

(22) Filed: Oct. 10, 2012

(65) Prior Publication Data

US 2013/0094112 A1    Apr. 18, 2013

(30) Foreign Application Priority Data

Oct. 15, 2011 (DE) .......... 10 2011 116 135

(51) Int. Cl.
*H02H 7/20* (2006.01)
*H01L 31/02* (2006.01)
*H02H 1/00* (2006.01)

(52) U.S. Cl.
CPC .......... *H01L 31/02021* (2013.01); *Y02E 10/50* (2013.01); *H02H 1/0015* (2013.01); *H02H 7/20* (2013.01)

(58) Field of Classification Search
CPC ............ H02H 7/20; H02H 9/50; H02H 3/00; H02H 9/08; H02H 7/26; H02H 1/0015; H02H 1/0023; G01R 31/40; G01R 31/08; H01H 9/30; H01H 33/00
See application file for complete search history.

(56) References Cited

U.S. PATENT DOCUMENTS

| 5,206,596 | A  | * | 4/1993 | Beihoff et al. ................ 324/536 |
| 7,834,637 | B2 | * | 11/2010 | Kojori et al. .................. 324/522 |
| 2011/0141644 | A1 | * | 6/2011 | Hastings et al. ............. 361/93.2 |

FOREIGN PATENT DOCUMENTS

| DE | 20 2010 008 494 U1 | 12/2010 |
| DE | 102011000737 A1 | 8/2012 |
| WO | 2010078303 A2 | 7/2010 |

* cited by examiner

*Primary Examiner* — Rexford Barnie
*Assistant Examiner* — Terrence Willoughby
(74) *Attorney, Agent, or Firm* — Brooks Kushman P.C.

(57) ABSTRACT

A photovoltaic installation includes a photovoltaic generator, electrical connector lines, an enabling signal source, and an arc discharge detector. The generator is configured to generate a DC voltage when an enable signal is applied to the generator. The electrical connector lines connect the generator to a voltage converter for the voltage converter to receive the DC voltage from the generator. The enabling signal source is configured to apply the enable signal to the generator. The arc discharge detector is configured to detect for an arc discharge by detecting for the presence on the connector lines of an AC voltage signal having characteristics indicative of an arc discharge. The arc discharge detector is further configured to cause the enabling signal source to stop applying the enable signal to the generator when an arc discharge is detected.

12 Claims, 5 Drawing Sheets

PHOTOVOLTAIC INSTALLATION

CROSS-REFERENCE TO RELATED APPLICATIONS

This application claims foreign priority benefits under 35 U.S.C. §119(a)-(d) to DE 10 2011 116 135.3, filed Oct. 15, 2011; the disclosure of which is hereby incorporated by reference in its entirety.

TECHNICAL FIELD

The present invention relates to a photovoltaic installation having a photovoltaic generator formed from photovoltaic modules connected in series.

BACKGROUND

High-voltages such as up to 1.5 kV occur in photovoltaic installations through the series connection of photo-elements to module strings, from module strings to photovoltaic modules, and from photovoltaic modules to module strings. The totality of these series-connected components is designated as a photovoltaic generator of the photovoltaic installation. The DC voltage produced by the photovoltaic generator is commonly routed through connector lines to a voltage converter such as an inverter. The inverter typically generates an output voltage having the voltage and frequency of a conventional AC network. This output voltage can be routed to electric loads or stored in a voltage supply system.

Faults can arise due to the high voltages on the components of the photovoltaic generator and particularly on the connector lines. The faults include insulation faults and arc discharges which can give rise to additional hazards that should be rapidly detected and quenched.

In principle, series arc discharges and parallel arc discharges can be distinguished from one another depending on whether the arc discharge occurs along a connector line or between two connector lines. This distinction will be discussed in greater detail with the aid of FIGS. 2 and 3.

Figure 2:
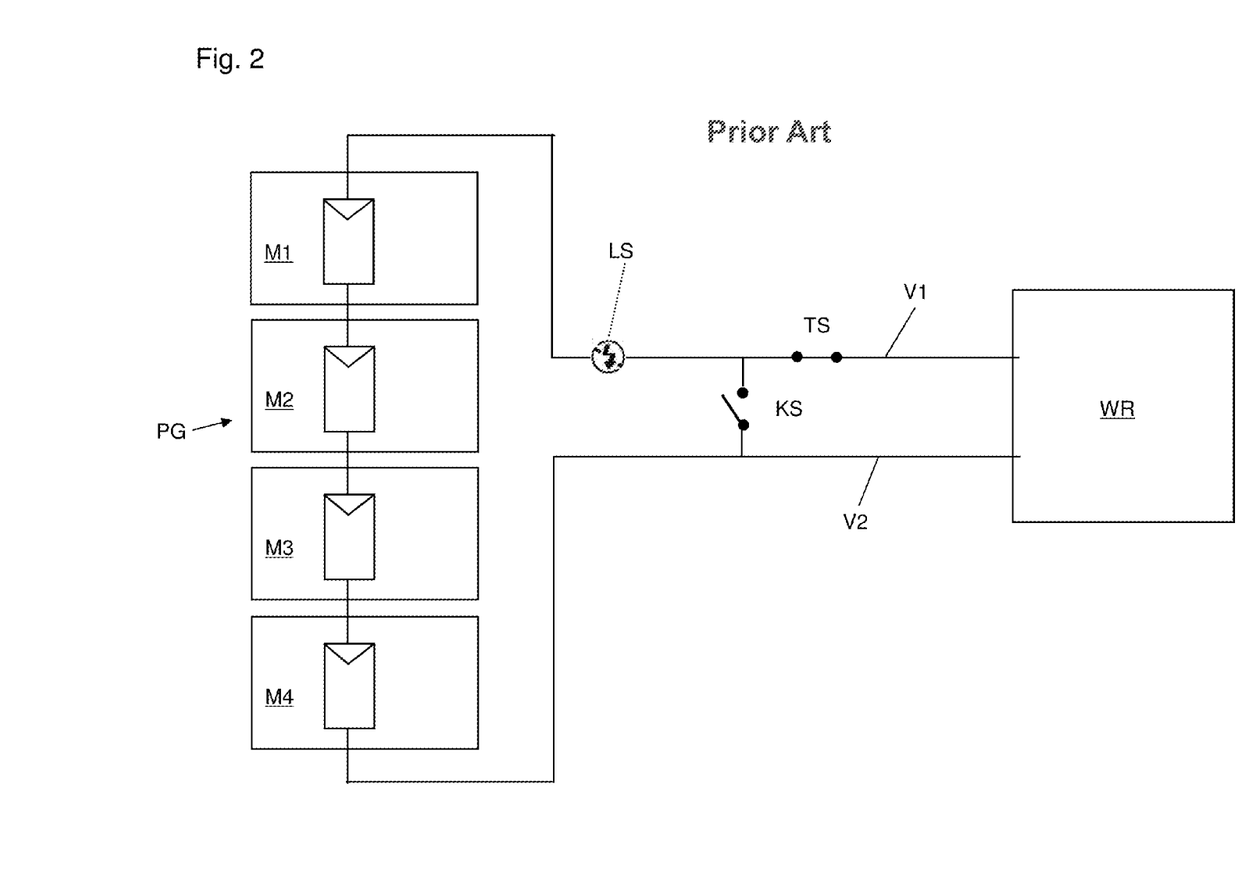
FIG. 2 illustrates a conventional photovoltaic installation in which a series arc discharge is present.
Figure 3:
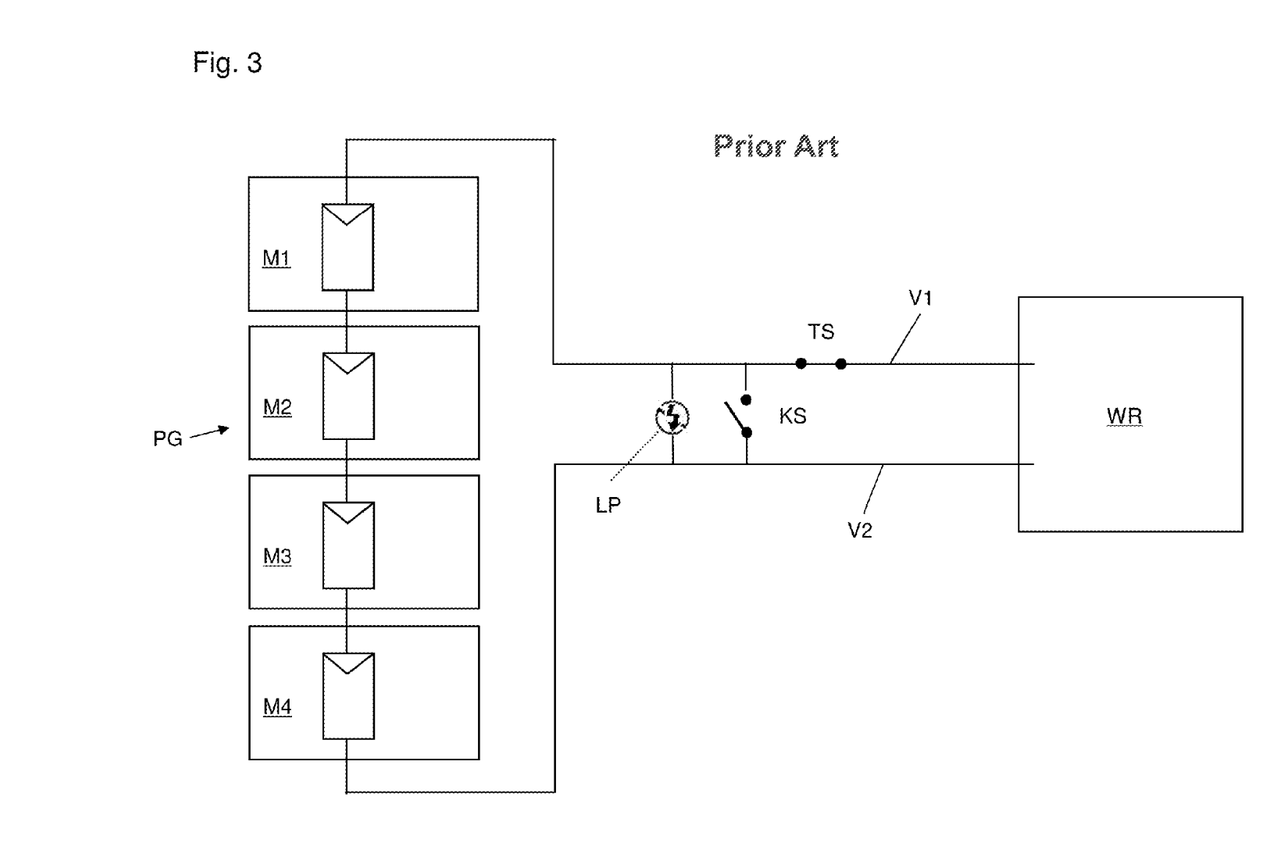
FIG. 3 illustrates the conventional photovoltaic installation in which a parallel arc discharge is present.

FIGS. 2 and 3 each illustrate a conventional photovoltaic installation. In particular, as explained below, FIG. 2 illustrates the conventional photovoltaic installation in which a series arc discharge LS is present and FIG. 3 illustrates the conventional photovoltaic installation in which a parallel arc discharge LP is present. The conventional photovoltaic installation includes a photovoltaic generator PG. As shown schematically in FIGS. 2 and 3, photovoltaic generator PG is formed from a simple series connection of four photovoltaic modules M1, M2, M3, M4. Actual embodiments of the photovoltaic generator can be significantly more complex. Photovoltaic generator PG is connected to the input of an inverter WR through two electrical connector lines V1, V2.

As the output voltage of photovoltaic generator PG typically has a high value, faults in connector lines V1, V2 can lead to arc discharges. DC voltage arc discharges are not self-quenching and can thus persist for a relatively long time unless suitable countermeasures are taken. This presents the danger of fire and personal injury.

The conventional photovoltaic installation further includes a circuit breaker TS and a short-circuiting switch KS. Circuit breaker TS and short-circuiting switch KS are for extinguishing series and parallel arc discharges LS, LP. Circuit breaker TS runs in series with one of connector lines V1, V2 as shown in FIGS. 2 and 3. Short-circuiting switch KS is connected across connector lines V1, V2 as shown in FIGS. 2 and 3. Circuit breaker TS and short-circuiting switch KS are activated or controlled by a suitable device (not shown) upon detection of an arc discharge LS, LP. Circuit breakers such as circuit breaker TS and short-circuiting switches such as short-circuiting switch KS are common means used for extinguishing series and parallel arc discharges.

As indicated above, FIG. 2 illustrates the conventional photovoltaic installation in which a series arc discharge LS is present. Series arc discharge LS generally arises from a poorly conducting section of either of connector lines V1, V2. In particular, series arc discharge LS may be ignited when high-voltage electricity is applied over the poorly conducting section of connector line V1, V2. Series arc discharge LS is maintained by the arc discharge current. If the current flowing to the poorly conducting section of connector line V1, V2 is interrupted, then series arc discharge LS extinguishes. Circuit breaker TS can enable such an interruption assuming that the current of series arc discharge LS flows through circuit breaker TS.

However, if a conducting connection is present between connector lines V1, V2 in front of circuit breaker TS such as in the region of short-circuiting switch KS as shown in FIGS. 2 and 3, then opening circuit breaker TS is ineffective in extinguishing series arc discharge LS. For this reason, short-circuiting switch KS is also not suitable for extinguishing series arc discharge LS. This is particularly the case when the closed short-circuiting switch KS does not reduce the arc current, but amplifies the arc current, which happens in most cases.

As indicated above, FIG. 3 illustrates the conventional photovoltaic installation in which a parallel arc discharge LP is present. Parallel arc discharge LP arises between connector lines V1, V2. Short-circuiting switch KS is usually effective in controlling parallel arc discharge LP. Short-circuiting switch KS causes low resistance bridging of the arc gap through which the voltage across parallel arc discharge LP drops to such a low value that the electric arc is extinguished. For this to occur, the sections of connector lines V1, V2 between the position of parallel arc discharge LP and short-circuiting switch KS have to remain intact. If these sections are damaged by closing short-circuiting switch KS, in particular by parallel arc discharge LP, then this function can fail. Circuit breaker TS is not effective here as circuit breaker TS is not connected in a section of connector lines V1, V2 between parallel arc discharge LP and photovoltaic generator PG.

In summary, in the conventional photovoltaic installation shown in FIGS. 2 and 3, the effectiveness of circuit breaker TS and short-circuiting switch KS for extinguishing arc discharges LS, LP depends on: (i) the type (serial or parallel) of arc discharge LS, LP with respect to the components of the photovoltaic installation; and (ii) any damage that arc discharge LS, LP has already caused by deploying the extinguishing measures on connector lines V1, V2. If these factors are unknown and are not taken into consideration, then a non-negligible probability exists that the measures described for extinguishing electric arcs will not be effective.

Optical sensors are used for detecting electric arcs. The optical sensors are configured to detect optical radiation that is typical of an electric arc. The position where an arc discharge occurs cannot normally be predicted. Thus, a relatively large amount of sensors are used for monitoring a spatially extended photovoltaic installation and this involves expense.

Figure 4:
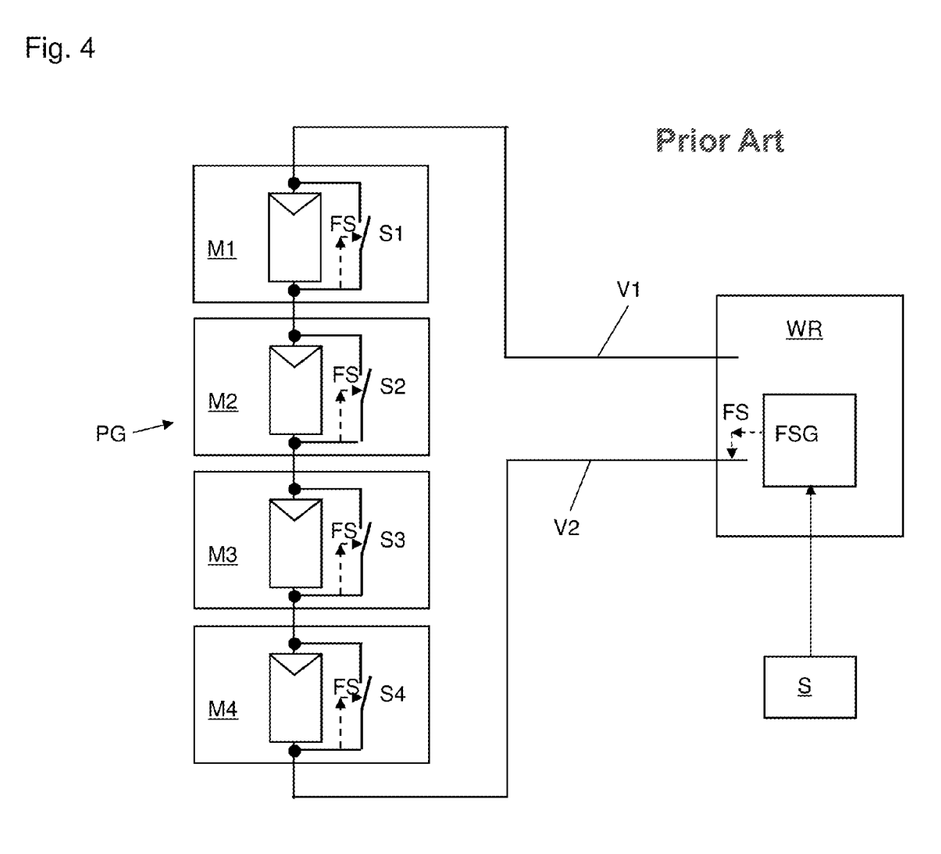
FIG. 4 illustrates a photovoltaic installation in accordance with the background art.

FIG. 4 illustrates a photovoltaic installation according to the operating principle suggested in DE 20 2010 008 494 U1. The photovoltaic installation includes a photovoltaic generator PG formed from a plurality of photovoltaic modules M1, M2, M3, M4 connected in series. Photovoltaic generator PG generates a DC voltage which is routed through connector lines V1, V2 to an inverter WR. The photovoltaic installation further includes an enabling signal generator FSG. Enabling signal generator FSG produces an enable signal FS. Enable signal FS is modulated on either of connector lines V1, V2. Enable signal FS controls switching elements S1, S2, S3, S4 of respective photovoltaic modules M1, M2, M3, M4. Switching elements S1, S2, S3, S4, in their opened state, are arranged in parallel to respective photovoltaic modules M1, M2, M3, M4.

The photovoltaic installation shown in FIG. 4 further includes a failure sensor S. DE 20 2010 008 494 U1 describes failure sensor S as being a smoke detector or a heat sensor. Upon detecting a failure, failure sensor S controls enabling signal generator FSG to stop emitting enable signal FS. Consequently, switching elements S1, S2, S3, S4 transition from their opened state into their closed state as enable signal FS has been removed. In their closed state, switching elements S1, S2, S3, S4 short circuit the subordinate photovoltaic modules M1, M2, M3, M4 and thus convert to a secure state.

DE 20 2010 008 494 U1 does not describe a failure or breakdown that can lead to arc discharges. Accordingly, fault sensor S is not described as being configured to detect arc discharges. In addition, information is lacking on how such a sensor could be made. Likewise, the problem of detecting and extinguishing different types of arc discharges (series and parallel) is not addressed.

SUMMARY

An object of the present invention includes a photovoltaic installation that enables dependable detection and extinguishing of arc discharges in a simple and economical manner.

In carrying out at least one of the above and other objects, the present invention provides a photovoltaic installation including a photovoltaic generator, a pair of electrical connector lines, an enabling signal generator, and an arc discharge detector. The photovoltaic generator includes a plurality of photovoltaic modules connected in series. The electrical connector lines are connected respectively to first and last ones of the modules. The enabling signal generator is configured to apply an enable signal to the modules. Each module has an electric-power generator and a switch arranged in parallel with one another. The switches are switchable to be opened when the enable signal is applied to the modules and to be closed when the enable signal is absent from the modules, wherein when closed the switches short circuit the electric-power generators. The arc discharge detector is configured to detect for an arc discharge by detecting for the presence on the connector lines of an AC voltage signal having characteristics indicative of an arc discharge. The arc discharge detector is further configured to cause the enabling signal generator to stop applying the enable signal when an arc discharge is detected.

In an embodiment, the arc discharge detector is further configured to detect for the presence on the connector lines of an AC voltage signal having the characteristic broad-band, high-frequencies of arc discharges in order to detect for an arc discharge.

Further, in carrying out at least one of the above and other objects, the present invention provides a photovoltaic installation including a photovoltaic generator, electrical connector lines, an enabling signal source, and an arc discharge detector. The generator is configured to generate a DC voltage when an enable signal is applied to the generator. The electrical connector lines connect the generator to a voltage converter for the voltage converter to receive the DC voltage from the generator. The enabling signal source is configured to apply the enable signal to the generator. The arc discharge detector is configured to detect for an arc discharge by detecting for the presence on the connector lines of an AC voltage signal having characteristics indicative of an arc discharge. The arc discharge detector is further configured to cause the enabling signal source to stop applying the enable signal to the generator when an arc discharge is detected.

Embodiments of the present invention are directed to a photovoltaic installation having a photovoltaic generator. The photovoltaic generator includes a plurality of photovoltaic modules connected in series for generating a DC voltage. The DC voltage is routed from the photovoltaic generator through electrical connector lines to a voltage converter such as an inverter WR. The photovoltaic installation further includes an enabling signal generator. The enabling signal generator is configured to remotely apply an enable signal to the photovoltaic generator. For instance, the enabling signal generator applies the enable signal to the photovoltaic generator via the connector lines. In other embodiments, the enabling signal generator applies the enable signal to the photovoltaic generator directly or via some other signal connection.

Each photovoltaic module includes a respective voltage-producing element field and a respective switching element. The switching elements are arranged in parallel with respective ones of the voltage-producing element fields. The enable signal of the enabling signal generator is for controlling the switching elements. Each switching element is controllable to be opened (e.g., a high resistance) when the enable signal is applied to the switching element and to be closed (e.g., a low resistance) when the enable signal is removed from the switching element. When opened, the switching elements do not affect their corresponding voltage-producing element fields. Conversely, when closed, the switching elements short circuit their corresponding voltage-producing element fields and thus convert the photovoltaic installation to a secure state.

The photovoltaic installation further includes an arc discharge detector (sensor). The arc discharge detector is coupled across the connector lines. The arc discharge detector is configured to detect for a fault such as an arc discharge and to cause the enable signal to be shut off when a fault is detected.

In particular, the arc discharge detector is configured to monitor the connector lines for the occurrence of broad-band, high-frequency AC voltage signals. A broad-band, high-frequency AC voltage signal on the connector lines indicates an arcing event. As such, the arc discharge detector detects for an AC voltage signal on the connector lines having the characteristic broad-band, high-frequencies of arc discharges. During the occurrence of a broad-band, high-frequency AC voltage signal, the arc discharge detector controls the enabling signal generator. Thereupon, the enabling signal generator stops applying the enable signal to the photovoltaic generator. As a result, the enable signal is no longer present in the photovoltaic modules. Consequently, the switching devices transition into their closed state and thereby bridge the voltage-producing element fields. The photovoltaic modules are thus internally short circuited and the energy is thereby removed from an active (series or parallel) arc discharge such that the arc discharge is extinguished.

As described, an arc discharge detector (sensor) in embodiments of the present invention detects for the occurrence of an AC voltage signal on the connector lines having broad-band, high-frequency characteristics of arc discharges. As such, the arc discharge detector is a fault sensor that can detect both series and parallel arc discharges in a simple and cost-effective manner.

Arc discharges generate a relatively broad band spectrum of interference frequencies. In embodiments of the present invention, the arc discharge detector is configured for detection of arc discharges by monitoring for high-frequency signals in a sub-region of the frequency band lying between 100 kHz and 1 MHz. The sub-region is selected as it contains typical interference frequencies for arc discharges, but does not overlap with the possible interference spectra of other sources of interference.

The above features, and other features and advantages of the present invention are readily apparent from the following detailed description thereof when taken in connection with the accompanying drawings. It is understood that the features stated above and to be explained below may be used not only in the particular stated combination, but also in other combinations or alone without departing from the scope of the present invention.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
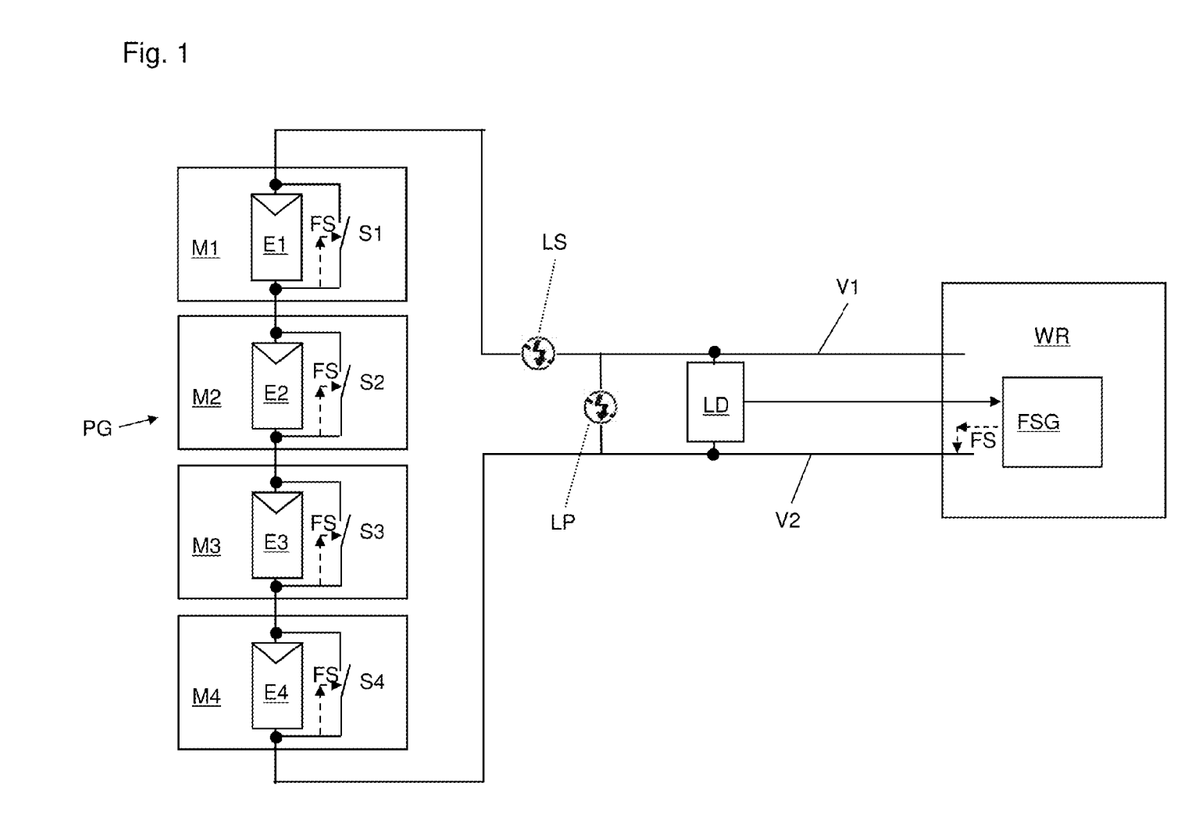
FIG. 1 illustrates a photovoltaic installation in accordance with an embodiment of the present invention.

Referring now to FIG. 1, a photovoltaic installation in accordance with an embodiment of the present invention is shown. The photovoltaic installation includes a photovoltaic generator PG formed from a plurality of photovoltaic modules M1, M2, M3, M4 connected in series. Photovoltaic generator PG generates a DC voltage. The DC voltage produced by photovoltaic generator PG is routed through electrical connector lines V1, V2 to a voltage converter such as an inverter WR. The photovoltaic installation further includes an enabling signal generator FSG. Enabling signal generator FSG can be part of inverter WR as shown in FIG. 1. Enabling signal generator FSG produces an enable signal FS. Enable signal FS can be modulated on either of connector lines V1, V2. For instance, as shown in FIG. 1, enable signal FS is modulated on second connector line V2.

Photovoltaic modules M1, M2, M3, M4 respectively include voltage-producing element fields E1, E2, E3, E4 and switching elements S1, S2, S3, S4. Voltage-producing element fields E1, E2, E3, E4 respectively correspond to switching elements S1, S2, S3, S4. Switching elements S1, S2, S3, S4 are arranged in parallel with their corresponding voltage-producing element fields E1, E2, E3, E4.

Switching elements S1, S2, S3, S4 are individually movable between closed and opened states. Switching elements S1, S2, S3, S4 are controllable by enable signal FS to move into one of the closed and opened states. In particular, switching elements S1, S2, S3, S4 are maintained in their opened state when enable signal FS is applied to the switching elements. In their opened state, switching elements S1, S2, S3, S4 are opened circuits and thereby do not affect their corresponding voltage-producing element fields E1, E2, E3, E4. Conversely, switching elements S1, S2, S3, S4 move into in their closed state when enable signal FS is removed from the switching elements. In their closed state, switching elements S1, S2, S3, S4 short circuit their corresponding voltage-producing element fields E1, E2, E3, E4 and thus convert the photovoltaic installation to a secure state.

The photovoltaic installation further includes an arc discharge detector LD. Arc discharge detector LD is coupled across connector lines V1, V2. Arc discharge detector LD monitors connector lines V1, V2 for the occurrence of broad-band, high-frequency AC voltage signals. A broad-band, high-frequency AC voltage signal on connector lines V1, V2 indicates an arcing event. Arc discharge detector LD can have analog frequency filters connected as bandpass filters, for example, or can contain a digital array that is able to analyze existing frequency components of a frequency spectrum (Fourier analysis).

During the occurrence of a broad-band, high-frequency AC voltage signal, which indicates an arcing event, arc discharge detector LD controls enabling signal generator FSG. Thereupon, enabling signal generator FSG regulates the emission of enable signal FS to remove the application of enable signal FS to connector lines V1, V2. In this event, as enable signal FS is no longer present in photovoltaic modules M1, M2, M3, M4, switching devices S1, S2, S3, S4 transition into their closed state and thereby bridge voltage-producing element fields E1, E2, E3, E4. Photovoltaic modules M1, M2, M3, M4 are thus internally short circuited. The energy is thereby removed from an active (series or parallel) arc discharge LS, LP such that the arc discharge is extinguished. This occurs whether a series or parallel arc discharge LS, LP is present.

It is advantageous when arc discharge detector LD determines neither the exact location nor the type (series or parallel) of the arc discharge, but only detects the occurrence of an arc discharge LS, LP. The extinguishing process then takes place in a decentralized manner at the level of photovoltaic modules M1, M2, M3, M4 as a reaction to the missing centrally controlled enable signal FS.

Figure 5:
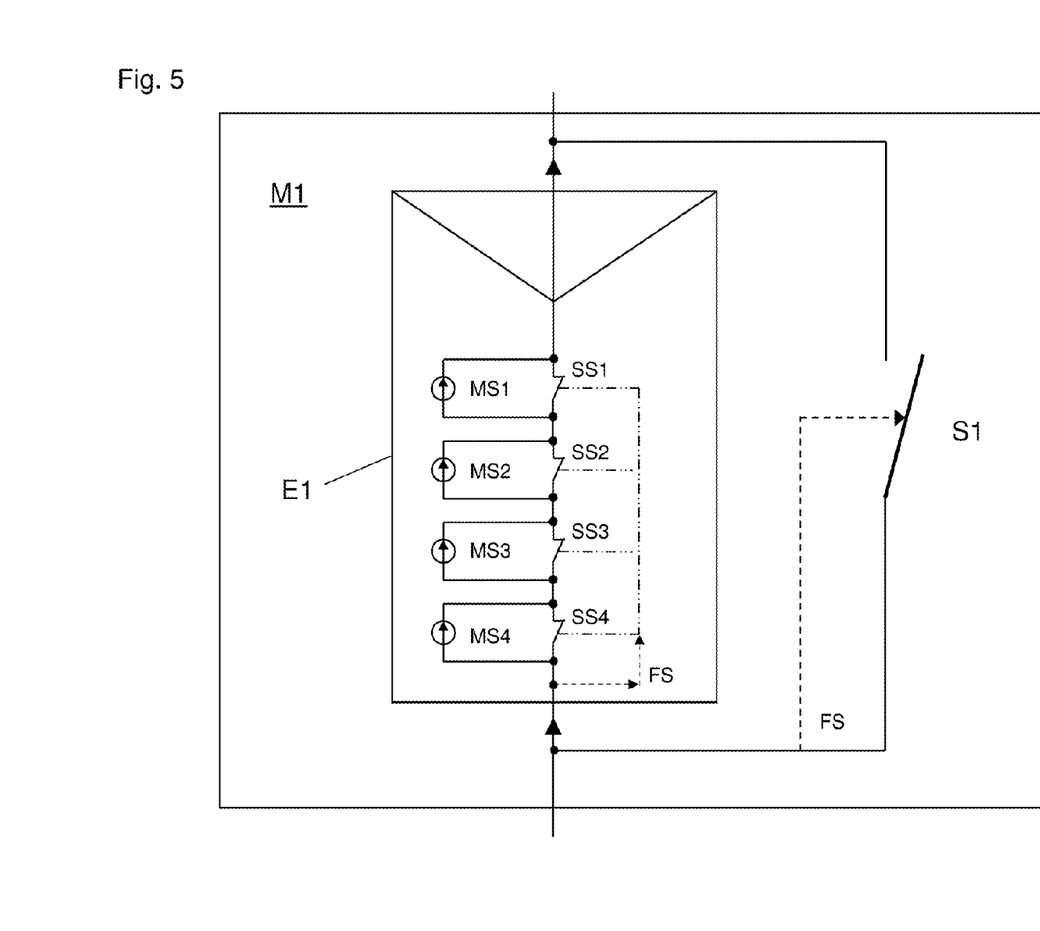
FIG. 5 illustrates an expanded view of a photovoltaic module of the photovoltaic generator of the photovoltaic installation shown in FIG. 1 in accordance with another embodiment of the present invention.

Referring now to FIG. 5, with continual reference to FIG. 1, an expanded view of a photovoltaic module of photovoltaic generator PG of the photovoltaic installation shown in FIG. 1 in accordance with another embodiment of the present invention is shown. The photovoltaic module shown in the expanded view in FIG. 5 is drawn as an example with the reference symbol M1. Photovoltaic module M1 as shown in FIG. 5 includes a voltage-generating element field E1 and a switching element S1 connected in parallel with voltage-generating element field E1. Voltage-generating element field E1 is a series connection of a plurality of so-called module strings MS1, MS2, MS3, MS4. Module strings MS1, MS2, MS3, MS4 respectively include a plurality of photocells (not shown).

Module disconnect (switch) elements SS1, SS2, SS3, SS4 are respectively connected in parallel to module strings MS1, MS2, MS3, MS4. Module disconnect elements SS1, SS2, SS3, SS4 respectively bridge the designated module strings MS1, MS2, MS3, MS4 in the resting state. When enable signal FS is applied to module disconnect elements SS1, SS2, SS3, SS4, the module disconnect elements open and thus switch the voltages of module strings MS1, MS2, MS3, MS4 to the connector lines of photovoltaic module M1. This additional enable control at module string MS1, MS2, MS3, MS4 level creates an even higher functional safety level by the creation of an additional disconnect instance. It is advantageous when relatively low voltages and electrical power are to be switched at module string level (MS1, MS2, MS3, MS4) than at the photovoltaic module level (M1, M2, M3, M4).

If an arc discharge is to be extinguished at the module string level (MS1, MS2, MS3, MS4), then the voltage is reduced over the module substrings that are affected by cutting off all other modules and substrings. Since the voltages and currents at the module string level are relatively small with respect to the overall system, the energy is insufficient to feed a continuous electric arc so that it is extinguished.

REFERENCE SYMBOLS

E1, E2, E3, E4 voltage-producing (electric power generating) element fields
FSG enabling signal generator
FS enable signal
KS short circuiting switch
LD arc discharge detector (sensor)
LP parallel arc discharge
LS series arc discharge
M1, M2, M3, M4 photovoltaic modules
MS1, MS2, MS3, MS4 module strings
PG photovoltaic generator
S fault sensor
S1, S2, S3, S4 switching elements (switching array)
SS1, SS2, SS3, SS4 module disconnect (switching) elements
TS circuit breaker
V1, V2 electrical connector lines
WR inverter While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A photovoltaic installation comprising:
a photovoltaic generator including photovoltaic modules connected in series for generating a DC voltage signal;
a pair of electrical connector lines connected respectively to first and last ones of the photovoltaic modules for receiving the DC voltage signal;
an enabling signal generator configured to apply an enable signal to the photovoltaic modules;
wherein each photovoltaic module has a DC electric-power generator and a switch arranged in parallel with one another, wherein the switches are switchable to be opened when the enable signal is applied to the photovoltaic modules and to be closed when the enable signal is absent from the photovoltaic modules, wherein when closed the switches short circuit each DC electric-power generator;
an arc discharge detector connected across the connector lines and configured to detect for an arc discharge while the connector lines receive the DC voltage signal by detecting for the presence on the connector lines of an AC voltage signal having broad-band, high-frequency AC voltage signal components within a sub-region of the frequency band between 100 kHz and 1 MHz indicative of a series or parallel arc discharge, wherein the arc discharge detector is further configured to cause the enabling signal generator to stop applying the enable signal when an arc discharge is detected.

2. The photovoltaic installation of claim 1 wherein:
the switches are in a rest state when closed and the switches are switchable to be opened by the application of the enable signal to the switches.

3. The photovoltaic installation of claim 2 wherein:
the switches return to the rest state and become closed when the application of the enable signal is removed from the switches.

4. The photovoltaic installation of claim 1 wherein:
the enabling signal generator is further configured to modulate the enable signal on at least one of the connector lines in order to apply the enable signal to the photovoltaic modules.

5. The photovoltaic installation of claim 1 wherein:
the DC electric-power generator of at least one of the photovoltaic modules includes a plurality of module strings and a plurality of module disconnect switches arranged in parallel with one another.

6. The photovoltaic installation of claim 5 wherein:
the module disconnect switches are switchable to be opened when the enable signal is applied to the at least one of the photovoltaic modules and to be closed when the enable signal is absent from the photovoltaic modules, wherein when closed the module disconnect switches short circuit the module strings of the DC electric-power generator of the at least one photovoltaic module.

7. A photovoltaic installation comprising:
a photovoltaic generator configured to generate a DC voltage when an enable signal is applied to the generator;
electrical connector lines connecting the generator to a voltage converter for the voltage converter to receive the DC voltage from the generator;
an enabling signal source configured to apply the enable signal to the generator; and
an arc discharge detector connected across the connector lines and configured to detect for an arc discharge while the connector lines receive the DC voltage by detecting for the presence on the connector lines of an AC voltage having broad-band, high-frequency AC voltage components within a sub-region of the frequency band between 100 kHz and 1 MHz indicative of a series or parallel arc discharge, wherein the arc discharge detector is further configured to cause the enabling signal source to stop applying the enable signal to the generator when an arc discharge is detected.

8. The photovoltaic installation of claim 7 wherein:
the enabling signal source is further configured to modulate the enable signal on at least one of the connector lines in order to apply the enable signal to the generator.

9. A photovoltaic installation comprising:
a photovoltaic generator including a photovoltaic module having a plurality of DC electric-power generators connected in series for generating a DC voltage signal, a main switch arranged in parallel with all of the DC electric-power generators, and a plurality of secondary switches each arranged in parallel with a respective one of the DC electric-power generators;

a pair of electrical connector lines connected respectively to opposite ends of the series of DC electric-power generators for receiving the DC voltage signal;

an enabling signal generator configured to apply an enable signal to the photovoltaic module;

wherein the main and secondary switches switch open when the enable signal is applied to the photovoltaic module and the main and secondary switches switch close when the enable signal is absent from the photovoltaic module, wherein when closed the main switch short circuits all of the electric-power generators and when closed the secondary switches short circuit the respective ones of the DC electric-power generators;

an arc discharge detector connected across the connector lines and configured to detect for an arc discharge while the connector lines receive the DC voltage signal by detecting for the presence on the connector lines of an AC voltage signal having broad-band, high-frequency AC voltage signal components within a sub-region of the frequency band between 100 kHz and 1 MHz indicative of a series or parallel arc discharge, wherein the arc discharge detector is further configured to cause the enabling signal generator to stop applying the enable signal when an arc discharge is detected.

10. The photovoltaic installation of claim 9 wherein:

the switches are in a rest state when closed and the switches are switchable to be opened by the application of the enable signal to the switches.

11. The photovoltaic installation of claim 10 wherein:

the switches return to the rest state and become closed when the application of the enable signal is removed from the switches.

12. The photovoltaic installation of claim 9 wherein:

the enabling signal generator is further configured to modulate the enable signal on at least one of the connector lines in order to apply the enable signal to the photovoltaic module.

* * * * *